(12) United States Patent
Liu et al.

(10) Patent No.: US 7,390,429 B2
(45) Date of Patent: Jun. 24, 2008

(54) METHOD AND COMPOSITION FOR ELECTROCHEMICAL MECHANICAL POLISHING PROCESSING

(75) Inventors: Feng Q. Liu, San Jose, CA (US);
Tianbao Du, Santa Clara, CA (US);
Alain Duboust, Sunnyvale, CA (US);
Wei-Yung Hsu, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 232 days.

(21) Appl. No.: 11/312,823

(22) Filed: Dec. 19, 2005

(65) Prior Publication Data

US 2006/0102872 A1 May 18, 2006

Related U.S. Application Data

(63) Continuation-in-part of application No. 10/845,754, filed on May 14, 2004, now abandoned, which is a continuation-in-part of application No. 10/608,404, filed on Jun. 26, 2003, now Pat. No. 7,160,432, and a continuation-in-part of application No. 10/456,220, filed on Jun. 6, 2003, now Pat. No. 7,232,514.

(51) Int. Cl.
*C09K 13/00* (2006.01)
*C09K 13/04* (2006.01)
*C09K 13/06* (2006.01)

(52) U.S. Cl. ............ 252/79.1; 252/79.2; 252/79.4; 438/693

(58) Field of Classification Search ............ 252/79.1, 252/79.2, 79.4; 438/692
See application file for complete search history.

(56) References Cited

U.S. PATENT DOCUMENTS

| | | | |
|---|---|---|---|
| 2,582,020 | A | 1/1952 | Emery |
| 3,239,441 | A | 3/1966 | Marosi |
| 3,873,512 | A | 3/1975 | Latanision |
| 4,263,113 | A | 4/1981 | Bernard |
| 4,369,099 | A | 1/1983 | Kohl et al. |
| 4,663,005 | A | 5/1987 | Edson |
| 4,666,683 | A | 5/1987 | Brown et al. |
| 4,793,895 | A | 12/1988 | Kaanta et al. |

(Continued)

FOREIGN PATENT DOCUMENTS

EP   0 527 537   2/1993

(Continued)

OTHER PUBLICATIONS

International Search Report and the Written Opinion for International Application No. PCT/US2006/015386 dated Oct. 24, 2006.

(Continued)

*Primary Examiner*—Duy-Vu N Deo
(74) *Attorney, Agent, or Firm*—Patterson & Sheridan (57) ABSTRACT

A method of processing a substrate having a conductive material layer disposed thereon is provided which includes positioning the substrate in a process apparatus and supplying a first polishing composition between to the substrate. The polishing composition comprises a first chelating agent, a second chelating agent, a first corrosion inhibitor, a second corrosion inhibitor, a suppressor, a solvent, and an inorganic acid based electrolyte to provide a pH between about 3 and about 10.

13 Claims, 2 Drawing Sheets

U.S. PATENT DOCUMENTS

| | | |
|---|---|---|
| 4,934,102 A | 6/1990 | Leach et al. |
| 4,992,135 A | 2/1991 | Doan |
| 5,002,645 A | 3/1991 | Eastland et al. |
| 5,096,550 A | 3/1992 | Mayer et al. |
| 5,114,548 A | 5/1992 | Rhoades |
| 5,129,981 A | 7/1992 | Wang et al. |
| 5,209,816 A | 5/1993 | Yu et al. |
| 5,217,586 A | 6/1993 | Datta et al. |
| 5,225,034 A | 7/1993 | Yu et al. |
| 5,256,565 A | 10/1993 | Bernhardt et al. |
| 5,340,370 A | 8/1994 | Cadien et al. |
| 5,391,258 A | 2/1995 | Branacaleoni et al. |
| 5,407,526 A | 4/1995 | Danielson et al. |
| 5,534,106 A | 7/1996 | Cote et al. |
| 5,543,032 A | 8/1996 | Datta et al. |
| 5,567,300 A | 10/1996 | Datta et al. |
| 5,575,706 A | 11/1996 | Tsai et al. |
| 5,770,095 A | 6/1998 | Sasaki et al. |
| 5,783,489 A | 7/1998 | Kaufman et al. |
| 5,800,577 A | 9/1998 | Kido |
| 5,804,507 A | 9/1998 | Perlov et al. |
| 5,807,165 A | 9/1998 | Uzoh et al. |
| 5,843,032 A | 12/1998 | Kastenhofer |
| 5,846,882 A | 12/1998 | Birang |
| 5,866,031 A | 2/1999 | Carpio et al. |
| 5,880,003 A | 3/1999 | Hayashi |
| 5,897,375 A | 4/1999 | Watts et al. |
| 5,911,619 A | 6/1999 | Uzoh et al. |
| 5,954,997 A | 9/1999 | Kaufman et al. |
| 5,965,036 A | 10/1999 | Maki et al. |
| 6,001,730 A | 12/1999 | Farkas et al. |
| 6,004,880 A | 12/1999 | Liu et al. |
| 6,027,669 A | 2/2000 | Miura et al. |
| 6,056,864 A | 5/2000 | Cheung |
| 6,063,306 A | 5/2000 | Kaufman et al. |
| 6,066,030 A | 5/2000 | Uzoh |
| 6,068,879 A | 5/2000 | Pasch |
| 6,077,412 A | 6/2000 | Ting et al. |
| 6,083,840 A | 7/2000 | Mravic et al. |
| 6,090,239 A | 7/2000 | Liu et al. |
| 6,096,652 A | 8/2000 | Watts et al. |
| 6,099,604 A | 8/2000 | Sandhu et al. |
| 6,103,096 A | 8/2000 | Datta et al. |
| 6,106,728 A | 8/2000 | Iida et al. |
| 6,117,775 A | 9/2000 | Kondo et al. |
| 6,117,783 A | 9/2000 | Small et al. |
| 6,117,853 A | 9/2000 | Sakai et al. |
| 6,121,152 A | 9/2000 | Adams et al. |
| 6,126,798 A | 10/2000 | Reid et al. |
| 6,126,853 A | 10/2000 | Kaufman et al. |
| 6,139,763 A | 10/2000 | Ina et al. |
| 6,143,155 A | 11/2000 | Adams et al. |
| 6,143,656 A | 11/2000 | Yang et al. |
| 6,153,043 A | 11/2000 | Edelstein et al. |
| 6,171,352 B1 | 1/2001 | Lee et al. |
| 6,176,992 B1 | 1/2001 | Talieh |
| 6,177,026 B1 | 1/2001 | Wang et al. |
| 6,190,237 B1 | 2/2001 | Huyng et al. |
| 6,194,317 B1 | 2/2001 | Kalsaki et al. |
| 6,206,756 B1 | 3/2001 | Chopra et al. |
| 6,217,416 B1 | 4/2001 | Kaufman et al. |
| 6,218,305 B1 | 4/2001 | Hosali et al. |
| 6,234,870 B1 | 5/2001 | Uzoh et al. |
| 6,238,592 B1 | 5/2001 | Hardy et al. |
| 6,248,222 B1 | 6/2001 | Wang |
| 6,258,711 B1 | 7/2001 | Laursen |
| 6,258,721 B1 | 7/2001 | Li et al. |
| 6,273,786 B1 | 8/2001 | Chopra et al. |
| 6,276,996 B1 | 8/2001 | Chopra |
| 6,280,598 B1 | 8/2001 | Barton et al. |
| 6,296,400 B1 | 10/2001 | Uchiyama et al. |
| 6,299,741 B1 | 10/2001 | Sun et al. |
| 6,303,049 B1 | 10/2001 | Lee et al. |
| 6,303,551 B1 | 10/2001 | Li et al. |
| 6,310,019 B1 | 10/2001 | Kakizawa et al. |
| 6,315,803 B1 | 11/2001 | Ina et al. |
| 6,315,883 B1 | 11/2001 | Mayer et al. |
| 6,348,076 B1 | 2/2002 | Canaperi et al. |
| 6,354,916 B1 | 3/2002 | Uzoh et al. |
| 6,355,075 B1 | 3/2002 | Ina et al. |
| 6,355,153 B1 | 3/2002 | Uzoh et al. |
| 6,361,422 B1 | 3/2002 | Ettinger et al. |
| 6,375,693 B1 | 4/2002 | Cote et al. |
| 6,379,223 B1 | 4/2002 | Sun et al. |
| 6,391,166 B1 | 5/2002 | Wang |
| 6,395,152 B1 | 5/2002 | Wang |
| 6,402,925 B2 | 6/2002 | Talieh |
| 6,416,685 B1 | 7/2002 | Zhang et al. |
| 6,419,554 B2 | 7/2002 | Chopra et al. |
| 6,428,721 B1 | 8/2002 | Ina et al. |
| 6,429,133 B1 | 8/2002 | Chopra |
| 6,440,186 B1 | 8/2002 | Sakai et al. |
| 6,440,295 B1 | 8/2002 | Wang |
| 6,447,371 B2 | 9/2002 | Brusic Kaufman et al. |
| 6,447,668 B1 | 9/2002 | Wang |
| 6,454,819 B1 | 9/2002 | Yano et al. |
| 6,455,479 B1 | 9/2002 | Sahbari |
| 6,508,952 B1 | 1/2003 | Lee et al. |
| 6,541,384 B1 | 4/2003 | Sun et al. |
| 6,551,935 B1 | 4/2003 | Sinha et al. |
| 6,555,158 B1 | 4/2003 | Yoshio et al. |
| 6,562,719 B2 | 5/2003 | Kondo et al. |
| 6,565,619 B1 | 5/2003 | Asano et al. |
| 6,568,997 B2 | 5/2003 | Costas et al. |
| 6,569,349 B1 | 5/2003 | Wang et al. |
| 6,579,153 B2 | 6/2003 | Uchikura et al. |
| 6,582,579 B1 | 6/2003 | Uzoh |
| 6,592,742 B2 | 7/2003 | Sun et al. |
| 6,593,239 B2 | 7/2003 | Kaufman et al. |
| 6,596,152 B2 | 7/2003 | Yang et al. |
| 6,596,638 B1 | 7/2003 | Kondo et al. |
| 6,602,112 B2 | 8/2003 | Tran et al. |
| 6,605,537 B2 | 8/2003 | Bian et al. |
| 6,613,200 B2 | 9/2003 | Li et al. |
| 6,616,976 B2 | 9/2003 | Montano et al. |
| 6,620,215 B2 | 9/2003 | Li et al. |
| 6,653,242 B1 | 11/2003 | Sun et al. |
| 6,676,484 B2 | 1/2004 | Chopra |
| 6,679,928 B2 | 1/2004 | Costas et al. |
| 6,679,929 B2 | 1/2004 | Asano et al. |
| 6,693,036 B1 | 2/2004 | Nogami et al. |
| 6,699,299 B2 | 3/2004 | Sanchan et al. |
| 6,736,952 B2 | 5/2004 | Emesh et al. |
| 6,811,680 B2 | 11/2004 | Chen et al. |
| 6,821,409 B2 | 11/2004 | Basol et al. |
| 6,821,841 B1 | 11/2004 | Tsai et al. |
| 6,837,983 B2 | 1/2005 | Duboust et al. |
| 6,852,630 B2 | 2/2005 | Basol et al. |
| 6,867,136 B2 | 3/2005 | Basol et al. |
| 6,893,476 B2 | 5/2005 | Siddiqui et al. |
| 6,899,804 B2 | 5/2005 | Duboust et al. |
| 6,902,659 B2 | 6/2005 | Talieh |
| 6,943,112 B2 | 9/2005 | Basol et al. |
| 6,946,066 B2 | 9/2005 | Basol et al. |
| 2001/0016469 A1 | 8/2001 | Chopra |
| 2001/0024878 A1 | 9/2001 | Nakamura |
| 2001/0036746 A1 | 11/2001 | Sato et al. |
| 2001/0042690 A1 | 11/2001 | Talieh |
| 2001/0052351 A1 | 12/2001 | Brown et al. |
| 2002/0008036 A1 | 1/2002 | Wang |
| 2002/0016064 A1 | 2/2002 | Komai et al. |
| 2002/0016073 A1 | 2/2002 | Kondo et al. |
| 2002/0016272 A1 | 2/2002 | Kakizawa et al. |
| 2002/0040100 A1 | 4/2002 | Kume et al. |

| | | | |
|---|---|---|---|
| 2002/0070126 A1 | 6/2002 | Sato et al. |
| 2002/0072309 A1 | 6/2002 | Sato et al. |
| 2002/0074230 A1 | 6/2002 | Basol |
| 2002/0088709 A1 | 7/2002 | Hongo et al. |
| 2002/0096659 A1 | 7/2002 | Sakai et al. |
| 2002/0104764 A1 | 8/2002 | Gautum et al. |
| 2002/0108861 A1 | 8/2002 | Emesh et al. |
| 2002/0108864 A1 | 8/2002 | Yang et al. |
| 2002/0119286 A1 | 8/2002 | Chen et al. |
| 2002/0130049 A1 | 9/2002 | Chen et al. |
| 2002/0139055 A1 | 10/2002 | Asano et al. |
| 2002/0160698 A1 | 10/2002 | Sato et al. |
| 2002/0182982 A1 | 12/2002 | Jui-Lung et al. |
| 2003/0019755 A1 | 1/2003 | Hey et al. |
| 2003/0038038 A1 | 2/2003 | Basol et al. |
| 2003/0073311 A1 | 4/2003 | Joseph et al. |
| 2003/0073386 A1 | 4/2003 | Ma et al. |
| 2003/0079416 A1 | 5/2003 | Ma et al. |
| 2003/0083214 A1 | 5/2003 | Kakizawa et al. |
| 2003/0104762 A1 | 6/2003 | Sato et al. |
| 2003/0113996 A1 | 6/2003 | Nogami et al. |
| 2003/0114004 A1 | 6/2003 | Sato et al. |
| 2003/0115475 A1 | 6/2003 | Russo et al. |
| 2003/0116445 A1 | 6/2003 | Sun et al. |
| 2003/0116446 A1 | 6/2003 | Duboust et al. |
| 2003/0119311 A1 | 6/2003 | Basol et al. |
| 2003/0136055 A1 | 7/2003 | Li et al. |
| 2003/0153184 A1 | 8/2003 | Wang et al. |
| 2003/0170091 A1 | 9/2003 | Shomler et al. |
| 2003/0178320 A1 | 9/2003 | Liu et al. |
| 2003/0216045 A1 | 11/2003 | Wang et al. |
| 2003/0234184 A1 | 12/2003 | Liu et al. |
| 2004/0053499 A1 | 3/2004 | Liu et al. |
| 2004/0067649 A1* | 4/2004 | Hellring et al. ............ 438/689 |
| 2004/0144038 A1 | 7/2004 | Siddiqui |
| 2004/0231994 A1 | 11/2004 | Basol et al. |
| 2004/0248412 A1 | 12/2004 | Liu et al. |
| 2005/0044803 A1 | 3/2005 | Siddiqui et al. |
| 2005/0056537 A1 | 3/2005 | Chen et al. |
| 2005/0076578 A1 | 4/2005 | Siddiqui et al. |
| 2005/0076579 A1 | 4/2005 | Siddiqui et al. |
| 2005/0079718 A1 | 4/2005 | Siddiqui et al. |
| 2005/0079803 A1 | 4/2005 | Siddiqui et al. |
| 2005/0092620 A1 | 5/2005 | Mavliev et al. |
| 2005/0145507 A1 | 7/2005 | Sun et al. |
| 2005/0218010 A1 | 10/2005 | Wang et al. |
| 2005/0227483 A1 | 10/2005 | Basol et al. |
| 2006/0006074 A1 | 1/2006 | Liu et al. |
| 2006/0009033 A1 | 1/2006 | Basol et al. |
| 2006/0011485 A1 | 1/2006 | Basol et al. |

FOREIGN PATENT DOCUMENTS

| | | |
|---|---|---|
| EP | 0 699 782 | 3/1996 |
| EP | 0 811 665 | 12/1997 |
| EP | 0 846 742 | 6/1998 |
| EP | 1 103 346 | 5/2001 |
| EP | 1 167 585 | 1/2002 |
| EP | 1 170 761 | 9/2002 |
| JP | 56-069070 | 10/1981 |
| JP | 58-093886 | 6/1983 |
| JP | 58-093899 | 6/1983 |
| JP | 05 302199 | 11/1993 |
| JP | 06-079533 | 3/1994 |
| JP | 06 158397 | 6/1994 |
| JP | 07-288253 | 10/1995 |
| JP | 07-312366 | 11/1995 |
| JP | 09-207029 | 8/1997 |
| JP | 10 121297 | 5/1998 |
| JP | 10-270412 | 10/1998 |
| JP | 11-277339 | 10/1999 |
| JP | 2000 192298 | 7/2000 |
| JP | 2000 256898 | 9/2000 |
| JP | 2001-77117 | 3/2001 |
| SU | 1 618 538 | 1/1991 |
| WO | WO 98/04646 | 2/1998 |
| WO | WO 98/49723 | 11/1998 |
| WO | WO 99/46081 | 9/1999 |
| WO | WO 99/46353 | 9/1999 |
| WO | WO 99/53532 | 10/1999 |
| WO | WO 99/65072 | 12/1999 |
| WO | 03/000426 | 1/2000 |
| WO | WO 00/03426 | 1/2000 |
| WO | WO 00/26443 | 5/2000 |
| WO | WO 00/55876 | 9/2000 |
| WO | WO 01/77241 | 10/2001 |
| WO | WO 02/23616 | 3/2002 |
| WO | WO 02/075804 | 9/2002 |
| WO | WO 02/088229 | 11/2002 |
| WO | WO 03/060962 | 7/2003 |
| WO | WO 03/072672 | 9/2003 |

OTHER PUBLICATIONS

First Official Letter dated May 26, 2006 for Chinese National Application No. 03807940.2.

Translation of First Official Letter dated May 26, 2006 for Chinese National Application No. 03807940.2.

Besser et al., "Mechanical Strain Evolution in Cu/low K Interconnect Lines", *Mat. Res. Soc. Symp. Proc.* vol. 795, 2004 Materials Research Society, pp. U1.1.1-U1.1.6.

Chandrasekaran, et al., "Effects of CMP Process Conditions on Defect Generation in Low-k Materials", *Journal of The Electrochemical Society*, pp. G882-G889 (2004).

Chang, et al., "Microleveling Mechanisms and Applications of Electropolishing of Copper Mettalization", *J. Vac. Sci. Technol. B 20*(5), Sep./Oct. 2002, pp. 2149-2152.

Chang, et al., "Superpolishing of Planarizing Copper Damascene Interconnects", *Electrochemical and Solid-State Letters*, pp. G72-G74 (2003).

Contolini, et al., "Electrochemical Planarization for Multilevel Metallization", *J. Electrochem. Soc.*, vol. 141, No. 9, Sep. 1994, pp. 2503-2510.

D. Landolt, "Fundamental Aspects of Electropolishing", Mar. 18, 1996, pp. 1-11.

Deshpande, et al., "Chemical Mechanical Planarization of Copper: Role of Oxidants and Inhibitors", *Journal of The Electrochemical Society*, pp. G788-G794 (2004).

Du, et al., "Effect of Hydrogen Peroxide on Oxidation of Copper in CMP Slurries Containing Glycine and Cu Ions", *Electrochimice Acta*, pp. 4505-4512 (2004).

Du, et al., Mechanism of Copper Removal During CMP in Acidic $H_2O_2$ Slurry, *Journal of The Electrochemical Society*, pp. G230-G235 (2004).

Economikos, et al., "Integrated Electro-Chemical Mechanical Planarization (Ecmp) for Future Generation Device Technology", 2004 IEEE, pp. 233-235.

Goonetilleke, et al., Voltage-Induced Material Removal for Electrochemical Mechanical Planarization of Copper in Electrolytes Containing $NO_{-3}$, Glycine, and $H_2O_2$, *Electrochemical and Solid-State Letters*, pp. G190-G193 (2005).

Hu, et al. "Copper Interconnection Integration and Reliability", *Thin Solid State Films*, pp. 84-92, (1995).

International Search Report for PCT/US02/04806 dated Apr. 1, 2003.

Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", *Eletrochimica Acta*, vol. 43, Nos. 3-4, pp. 265-274, 1998.

Kaufman, et al., "Chemical-Mechanical Polishing for Fabricating Patterned W Metal Features as Chip Interconnects", *J. Electrochem. Soc.*, vol. 138, No. 11, Nov. 1991; The Electrochemical Society, Inc. pp. 3460-3465.

Kondo, et al., "Role of Additives for Copper Damascene Electrodeposition: Experimental Study on Inhibition and Acceleration Effects", *Journal of The Electrochemical Society*, pp. C250-C255 (2004).

Mansikkamaki, et al., "Inhibitive Effect of Benzotriazole on Copper Surfaces Studied by SECM", *Journal of the Electrochemical Society*, pp. B12-B16 (2005).

Nogami," An Innovation to Integrate Porous Low-K Materials and Copper", *InterConnect Japan 2001*; Honeywell Seminar (Dec. 6, 2001) pp. 1-12.

Padhi, et al., "Planarization of Copper Thin Films by Electropolishing in Phosphoric Acid for ULSI Applications", *Journal of the Electrochemical Society*, 150, pp. G10-G14 (2003).

Partial International Search Report for US 02/40754 dated Apr. 28, 2003.

PCT International Preliminary Examination Report for PCT/US02/04806, dated Sep. 7, 2004.

PCT International Preliminary Examination Report for PCT/US03/06058, dated Sep. 7, 2004.

PCT International Search Report for PCT/US04/17691, dated Nov. 16, 2004.

PCT International Search Report for US 03/06058 dated Jun. 25, 2003.

PCT Written Opinion for PCT/US02/04806, dated Mar. 9, 2004.

PCT Written Opinion for PCT/US03/06058, dated Feb. 13, 2004.

PCT Written Opinion for PCT/US04/17691, dated Nov. 16, 2004.

Qafsaoui, et al., "Quantitative Characterization of Protective Films Grown on Copper in the Presence of Different Triazole Derivative Inhibitors", *Electrochimica Acta 47* (2002), pp. 4339-4346.

Robert J. Contolini, "Electrochemical Planarization of ULSI Copper" Jun. 1997, Solid State Technology, pp. 155-156, 158 and 160.

Steigerwald, et al., "Effect of Copper Ions in the Slurry on the Chemical-Mechanical Polish Rate of Titanium", *J. Electrochem. Soc.*, vol. 141, No. 12, Dec. 1994, pp. 3512-3516.

Tamilmani, et al., "Potential-pH Diagrams of Interest to Chemical Mechanical Planarization of Copper", *Journal of The Electrochemical Society*, V. 149, pp. G638-G642 (2002).

Tromans, et al., "Growth of Passivating CuBTA Films on Copper in Aqueous Chloride/Benzotriazole Solutions'", *Electrochemical and Solid-State Letter*, V. 5, pp. B5-B8 (2002).

Wang, et al., "Inhibition Effect of AC-Treated, Mixed Self-Assembled Film of Phenylthiourea and 1-Dodecanethiol on Copper Corrosion", *Journal of The Electrochemical Society*, pp. B11-B15 (2004).

PCT Notification Concerning Transmittal of International Preliminary Report on Patentability for PCT/US04/017691 dated Dec. 22, 2005.

PCT Written Opinion of the International Searching Authority for PCT/US04/017691 dated Dec. 22, 2005.

PCT International Search Report and Written Opinion dated Nov. 15, 2007 for International Application No. PCT/US2006/40123.

Japanese Office Action dated Dec. 4, 2007 for Application No. P2002-574121.

\* cited by examiner

METHOD AND COMPOSITION FOR ELECTROCHEMICAL MECHANICAL POLISHING PROCESSING

CROSS-REFERENCE TO RELATED APPLICATIONS

This application is a continuation-in-part of U.S. patent application Ser. No. 10/845,754, filed May 14, 2005, now abandoned entitled "Method and Composition for Fine Copper Slurry for Low Dishing in Ecmp," which application is a continuation-in-part of U.S. patent application Ser. No. 10/608,404, filed Jun. 26, 2003, issued as U.S. Pat. No. 7,160, 432, entitled "Method and Composition for Polishing a Substrate," and is also a continuation-in-part of U.S. Pat. application Ser. No. 10/456,220, filed Jun. 6, 2003, issued as U.S. Pat. No. 7,232,514, entitled "Method and Composition for Polishing a Substrate," of which all applications are incorporated by reference herein.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material, removing undesired surface topography, and surface defects, such as surface roughness, agglomerated materials, crystal lattice damage, scratches and contaminated layers or materials to provide an even surface for subsequent photolithography and other semiconductor processes.

Chemical mechanical planarization or chemical mechanical polishing (CMP) is a common technique used to planarize substrates. In conventional CMP techniques, a substrate carrier or polishing head is mounted on a carrier assembly and positioned in contact with a polishing article in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing article while dispersing a polishing composition to effect both chemical activity and mechanical activity.

Figure 1A:
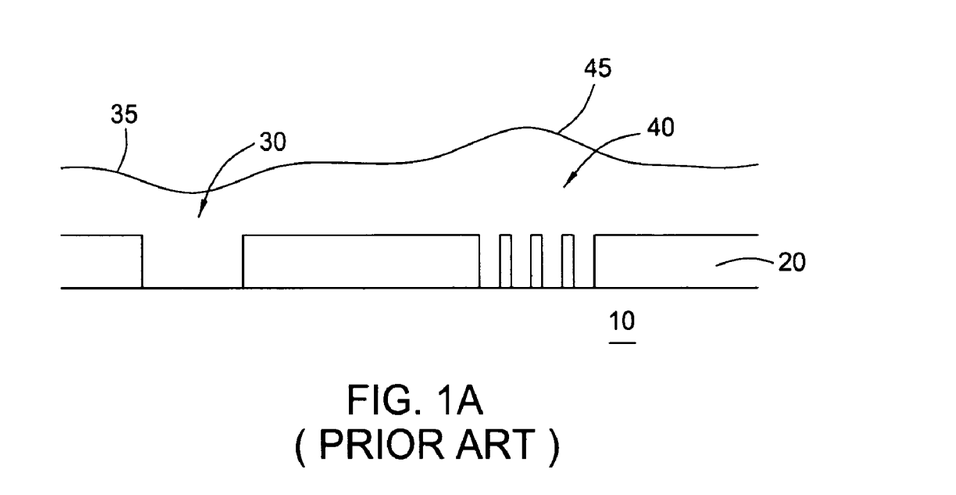
FIGS. 1A-1B are schematic cross-sectional views illustrating a polishing process performed on a substrate according to conventional processes.
Figure 1B:
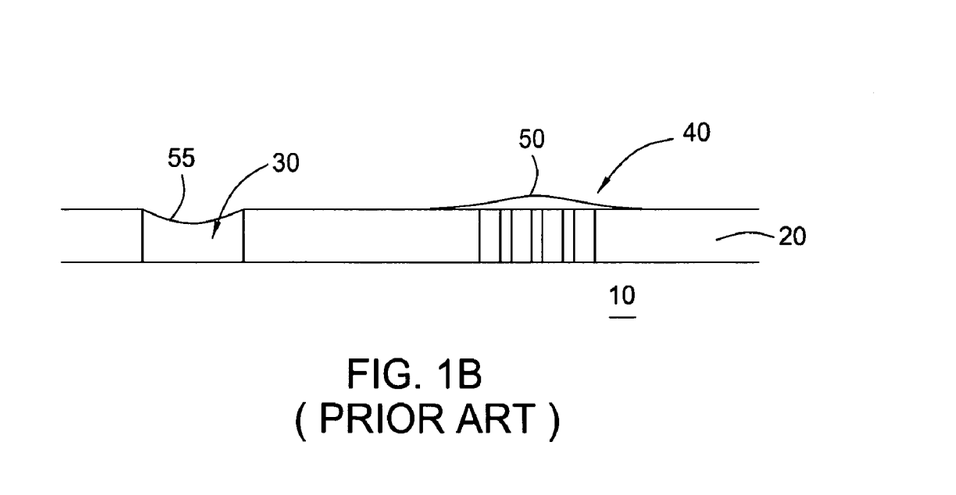

However, materials deposited on the surface of a substrate to fill feature definitions formed therein often result in unevenly formed surfaces over feature definitions of variable density. Referring to FIG. 1A, a metal layer 20 is deposited on a substrate 10 to fill wide feature definitions 30, also known as low density feature definitions, or narrow feature definitions 40, also known as and high density feature definitions. Excess material, called overburden, may be formed with a greater thickness 45 over the narrow feature definitions 40 and may have minimal deposition 35 over wide feature definitions 30. Polishing of surfaces with overburden may result in the retention of residues 50 from inadequate metal removal over narrow features. Overpolishing processes to remove such residues 50 may result in excess metal removal over wide feature definitions 30. Excess metal removal can form topographical defects, such as concavities or depressions known as dishing 55, over wide features, as shown in FIG. 1B.

Dishing of features and retention of residues on the substrate surface are undesirable since dishing and residues may detrimentally affect subsequent processing of the substrate. For example, dishing results in a non-planar surface that impairs the ability to print high-resolution lines during subsequent photolithographic steps and detrimentally affects subsequent surface topography of the substrate, which affects device formation and yields. Dishing also detrimentally affects the performance of devices by lowering the conductance and increasing the resistance of the devices, causing device variability and device yield loss. Residues may lead to uneven polishing of subsequent materials, such as barrier layer materials (not shown) disposed between the conductive material and the substrate surface. Post CMP profiles generally show higher dishing on wide trenches than on narrow trenches or dense areas. Uneven polishing will also increase defect formation in devices and reduce substrate yields.

One approach to polish substrate surfaces with minimal defects is by an electrochemical mechanical polishing technique. In an electrochemical mechanical polishing technique, the material to be polished is removed additionally by anodic dissolution compared to chemical mechanical polishing. In one example of an electrochemical mechanical polishing technique described in commonly owned U.S. Pat. No. 6,811, 680, issued on Nov. 2, 2004, a passivation layer is formed on the substrate surface to inhibit anodic dissolution until the passivation layer is removed by mechanical forces. However, passivation layers in electrochemical mechanical polishing processes may be difficult to remove under the mechanical forces used in such processes. The difficult removal of the passivation layer may result in less than desirable surface finishing and may still require some overpolishing to remove residual materials remaining after passivation layer removal.

Therefore, there is a need for compositions and methods for removing conductive material from a substrate that minimizes damage to the substrate during planarization.

SUMMARY OF THE INVENTION

In one embodiment, a method of processing a substrate having a conductive material layer disposed thereon is provided which includes positioning the substrate in a process apparatus and supplying a polishing composition to the substrate. The polishing composition comprises a first chelating agent, a second chelating agent, a first corrosion inhibitor, a second corrosion inhibitor, a suppressor, a solvent, and an inorganic acid based electrolyte to provide a pH between about 3 and about 10.

In another embodiment, a composition for removing at least a conductive material from a substrate surface, comprises a first chelating agent having one or more carboxylate functional groups, a second chelating agent having one or more amine or amide functional groups, a first corrosion inhibitor having the structure:

wherein R is hydrogen, an alkyl, hydroxy, amino, imino, carboxy, mercapto, nitro, or aryl functional group, $R_1$ and $R_2$ together comprise a fused ring, or $R_1$ and $R_2$ are each independently selected from the group of an alkyl, an aryl, or hydrogen, wherein $R_1$ and $R_2$ comprise one or fewer hydrogen atoms, a second corrosion inhibitor having a structure:

wherein R, $R_3$, and $R_4$ are each independently selected from the group of hydrogen or an alkyl, hydroxy, amino, imino, carboxy, mercapto, nitro, benzoyl, or aryl functional group, and $R_5$ and $R_6$ together are a fused ring, or $R_5$ and $R_6$ are each independently selected from the group of hydrogen, alkyl, hydroxy, amino, imino, carboxy, mercapto, nitro, or aryl functional group, wherein $R_5$ and $R_6$ comprise one or fewer hydrogen atoms, a suppressor, a solvent, and an inorganic acid based electrolyte to provide a pH between about 3 and about 10, wherein the composition has a conductivity between about 10 mS/cm and about 80 mS/cm.

In another embodiment, a composition for removing at least a conductive material from a substrate surface, comprises a first chelating agent having one or more carboxylate functional groups, a second chelating agent having one or more amine or amide functional groups, a first corrosion inhibitor having the structure:

wherein R is hydrogen, an alkyl, hydroxy, amino, imino, carboxy, mercapto, nitro, or aryl functional group, $R_1$ and $R_2$ together comprise a fused ring, or $R_1$ and $R_2$ are each independently selected from the group of an alkyl, an aryl, or hydrogen, wherein $R_1$ and $R_2$ comprise one or fewer hydrogen atoms. The composition further contains a surfactant, a suppressor, a solvent, and an inorganic acid based electrolyte to provide a pH between about 3 and about 10, wherein the composition has a conductivity between about 10 mS/cm and about 80 mS/cm.

In another embodiment, a method of removing a conductive material layer is provided which includes providing the substrate to a process apparatus, exposing the substrate to the composition described herein, forming a passivation layer on the conductive material, abrading the passivation layer to expose a portion of the conductive material, applying a bias to the substrate and removing the conductive material.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the inventions provide compositions and methods for removing at least a conductive material from a substrate surface. The inventions are described below in reference to a planarizing process for the removal of conductive materials from a substrate surface by an electrochemical mechanical polishing (Ecmp) technique.

The words and phrases used herein should be given their ordinary and customary meaning in the art by one skilled in the art unless otherwise further defined. Chemical mechanical polishing should be broadly construed and includes, but is not limited to, planarizing a substrate surface using chemical activity and mechanical activity, or a concurrent application of chemical activity and mechanical activity. Electropolishing should be broadly construed and includes, but is not limited to, removing material from a substrate by eroding the substrate surface under application of current. Electrochemical mechanical polishing (Ecmp) should be broadly construed and includes, but is not limited to, planarizing a substrate by the application of electrochemical activity, mechanical activity, chemical activity, or a concurrent application of a combination of electrochemical, chemical, and/or mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each electrolyte component in polishing compositions can be measured in volume percent or weight percent. Volume percent refers to a percentage based on volume of a desired liquid component divided by the total volume of all of the liquid in the complete composition. A percentage based on weight percent is the weight of the desired component divided by the total weight of all of the liquid components in the complete composition. Abrading and abrasion should be broadly construed and includes, but is not limited to, contacting a material and displacing, disturbing, or removing all or a portion of a material.

The electrochemical mechanical polishing process described herein may be performed in a process apparatus, such as a platform having one or more polishing stations adapted for electrochemical mechanical polishing processes, as described in co-pending U.S. patent application Ser, No. 10/378,097, filed on Feb. 26, 2003, which is incorporated herein by reference to the extent not inconsistent with the description and claimed aspects herein. An example of a suitable processing system is the Reflection LK Ecmp™ processing system, available from Applied Materials, Inc., of Santa Clara, Calif.

Polishing Processes

Methods and compositions are provided for polishing a substrate to remove residues and minimize dishing within features, while increasing throughput with a decrease in polishing time. The methods may be performed by an electrochemical polishing technique. In one aspect, the method may include processing a substrate having a conductive material layer disposed over features, supplying a polishing composition as described herein to the surface of the substrate, applying a pressure between the substrate and a polishing article, providing relative motion between the substrate and the polishing article, applying a bias between a first electrode and a second electrode in electrical contact with the substrate, and removing at least a portion of the conductive material from the substrate surface.

Figure 2A:
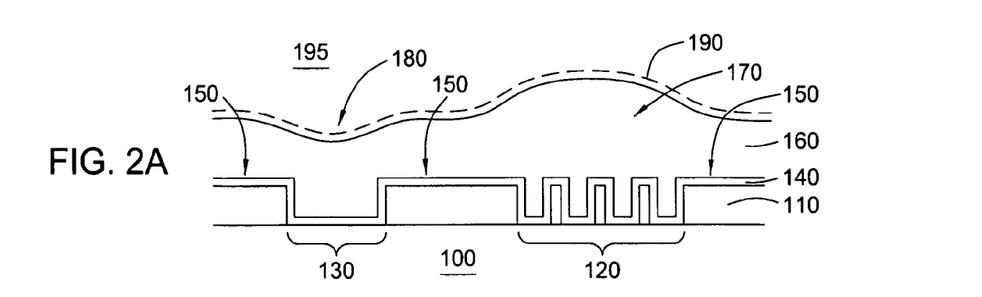
FIGS. 2A-2E are schematic cross-sectional views illustrating a polishing process performed on a substrate according to one embodiment for planarizing a substrate surface described herein.

One embodiment of the process will now be described in reference to FIGS. 2A-2E, which are schematic cross-sectional views of a substrate being processed according to methods and compositions described herein. Referring to FIG. 2A, a substrate generally includes a dielectric layer 110 formed on a substrate 100. A plurality of apertures, such as vias, trenches, contacts, or holes, are patterned and etched into the dielectric layer 110, such as a dense array of narrow feature definitions 120 and low density of wide feature definitions 130. The apertures may be formed in the dielectric layer 110 by conventional photolithographic and etching techniques.

Figure 2B:
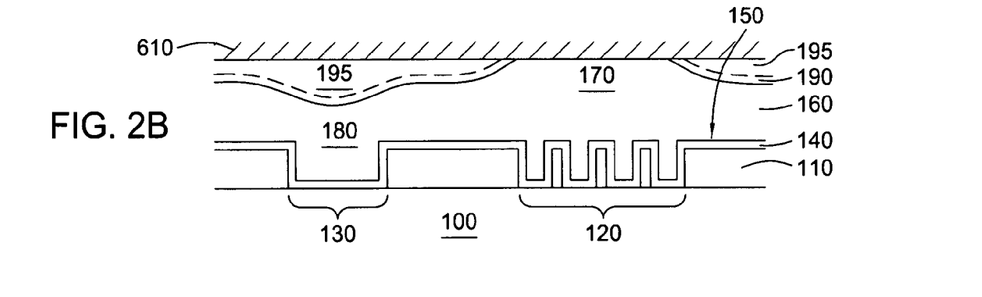
Figure 2C:
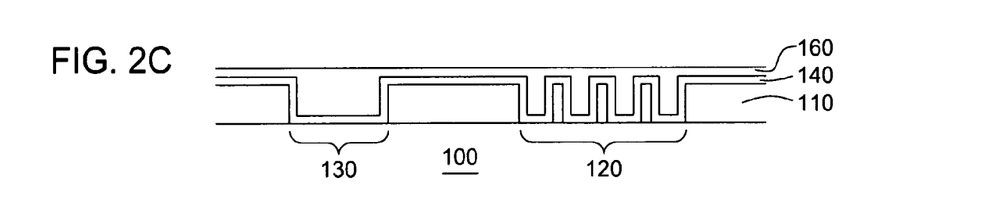
Figure 2D:
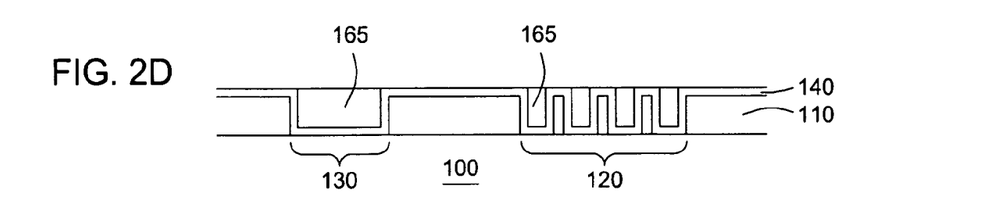
Figure 2E:
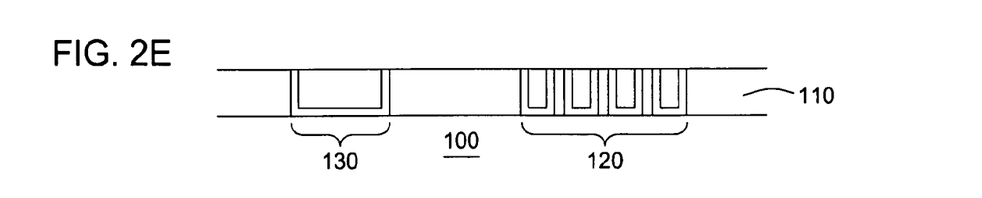

FIG. 2A depicts a substrate 100 and a conductive material 160 with a passivation layer 190 formed thereon before an Ecmp process has been applied. FIG. 2B illustrates the contact of the substrate surface with a polishing article to remove a portion of the passivation layer 190 formed thereon. FIG. 2C illustrates the substrate after a portion of the conductive material 160, such as at least about 50% of the conductive material 160, has been removed by applying a first Ecmp process. The remaining conductive layer 160 disposed upon a barrier layer 140 is removed to the barrier layer 140 by applying a second Ecmp process, as illustrated in FIG. 2D. Furthermore, as illustrated in FIG. 2E, the remaining barrier layer 140 on the dielectric layer 110 may be removed by a third process, such as a CMP process or a third Ecmp process. Alternatively, and not shone, the remaining conductive material 160 and the barrier layer material 140 may be removed in a single processing step.

The terms narrow and wide feature definitions may vary depending on the structures formed on the substrate surface, but can generally be characterized by the respective deposition profiles of excessive material deposition (or high overburden) formed over narrow feature definitions and minimal or low material deposition (minimal or low overburden), over wide feature definitions. For example narrow feature definitions may be about 0.13 μm in size and may have a high overburden as compared to wide feature definitions that may be about 10 μm in size and that may have minimal or insufficient overburden. However, high overburdens and low overburdens do not necessarily have to form over features, but may form over areas on the substrate surface between features.

The dielectric layer 110 may comprise one or more dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluorosilicon glass (FSG), polymers, such as polyamides, carbon-containing silicon oxides, such as BLACK DIAMOND™ dielectric material, silicon carbide materials, which may be doped with nitrogen and/or oxygen, including BLOK™ dielectric materials, available from Applied Materials, Inc. of Santa Clara, Calif.

A barrier layer 140 is disposed conformally in the feature definitions 120 and 130 and on the substrate 100. The barrier layer 140 may comprise metals or metal nitrides, such as tantalum, tantalum nitride, tantalum silicon nitride, titanium, titanium nitride, titanium silicon nitride, tungsten, tungsten nitride or combinations thereof, or any other material that may limit diffusion of materials between the substrate and/or dielectric materials and any subsequently deposited conductive materials.

A conductive material layer 160 is disposed on the barrier layer 140. The term "conductive material layer" as used herein is defined as any conductive material, such as copper, tungsten, aluminum, silver or an alloy thereof, used to fill a feature to form lines, contacts or vias. While not shown, a seed layer of a conductive material may be deposited on the barrier layer prior to the deposition of the conductive material layer 160 to improve interlayer adhesion and improve subsequent deposition processes. The seed layer may be of the same material as the subsequent material to be deposited.

One type of conductive material layer 160 comprises copper containing materials. Copper containing materials include copper, copper alloys (e.g., copper-based alloys containing at least about 80 weight percent copper) or doped copper. As used throughout this disclosure, the phrase "copper containing material," the word "copper," and the symbol "Cu" are intended to encompass copper, copper alloys, doped copper, or combinations thereof. Additionally, the conductive material may comprise any conductive material used in semiconductor manufacturing processing.

In one embodiment, the deposited conductive material layer 160 has a deposition profile of excessive material deposition or high overburden 170, also referred to as a hill or peak, formed over narrow feature definitions 120 and minimal overburden 180, also referred to as a valley, over wide feature definitions 130. In another embodiment, high overburdens and minimal overburdens are arbitrarily formed across the substrate surface between features.

An electrochemical mechanical polishing technique using a combination of chemical activity, mechanical activity and electrical activity to remove material and planarize a substrate surface may be performed as follows. In one embodiment of an electrochemical mechanical polishing technique, the substrate is disposed in a receptacle, such as a platen containing a first electrode and a polishing composition. The polishing composition forms a passivation layer on the substrate surface. The passivation layer may chemically and/or electrically insulate material disposed on a substrate surface.

A polishing article coupled to a polishing article assembly containing a second electrode is then disposed in the platen and physically contacted and/or electrically coupled with the substrate through the polishing article. Relative motion is provided between the substrate surface and the conductive article to reduce or remove the passivation layer. A bias from a power source is applied between the two electrodes. The bias may be applied by an electrical pulse modulation technique providing at least anodic dissolution. The bias may be transferred from a conductive article in the polishing article assembly to the substrate.

A first Ecmp process may be used to remove bulk conductive material from the substrate surface as shown from FIGS. 2B-2C and then a second Ecmp process to remove residual copper containing materials as shown from FIGS. 2C-2D. Bulk material is broadly defined herein as any material deposited on the substrate in an amount more than sufficient to substantially fill features formed on the substrate surface. Residual material is broadly defined as any bulk copper containing material remaining after one or more polishing process steps. Generally, the bulk removal during a first Ecmp process removes at least about 50% of the conductive layer, preferably at least about 70%, more preferably at least about 80%, for example, at least about 90%. The residual removal during a second Ecmp process removes most, if not all the remaining conductive material disposed on the barrier layer to leave behind the filled plugs. In an alternative embodiment of the Ecmp process, the entire conductive material may be removed from the substrate surface in a single processing step.

The first Ecmp process attributes to the throughput of substrate manufacturing due to a fast removal rate of the conductive layer. However, if the first Ecmp process is used solely, too much conductive material may be removed to produce an under burden. The second Ecmp process attributes to the throughput of substrate manufacturing due to the precise removal the conductive layer to form level substrate surfaces. Therefore, the combined first and second Ecmp processes increases throughput and produces high quality planar substrate surfaces.

The bulk removal Ecmp process may be performed on a first polishing platen and the residual removal Ecmp process on a second polishing platen of the same or different polishing apparatus as the first platen. In another embodiment, the residual removal Ecmp process may be performed on the first platen. Any barrier material may be removed on a separate platen, such as the third platen. For example, an apparatus in accordance with the processes described herein may include three platens for removing bulk material or comprise one platen to remove bulk material, a second platen for residual removal and a third platen for barrier removal, wherein the bulk and the residual processes are Ecmp processes and the barrier removal is a CMP process. In another embodiment, three Ecmp platens may be used to remove bulk material, residual removal and barrier removal.

The Ecmp process begins by positioning the substrate in a polishing apparatus and exposed to a polishing composition 195 that can form a passivation layer 190 on the conductive material layer. The passivation layer may be formed by the polishing compositions described herein.

Although the polishing compositions are particularly useful for removing copper, it is believed that the polishing compositions also may be used for the removal of other conductive materials, such as aluminum, platinum, tungsten, titanium, titanium nitride, tantalum, tantalum nitride, cobalt, gold, silver, ruthenium or combinations thereof. Mechanical abrasion, such as from contact with the conducive polishing article may be used with the polishing composition to improve planarity and improve removal rate of these conductive materials.

Novel polishing compositions described herein to planarize conductive materials, such as metals, including copper, may comprise a first chelating agent having one or more carboxylate functional groups, a second chelating agent having one or more amine or amide functional groups, a first corrosion inhibitor having the structure:

wherein R is hydrogen, an alkyl, hydroxy, amino, imino, carboxy, mercapto, nitro, or aryl functional group, $R_1$ and $R_2$ together comprise a fused ring, or $R_1$ and $R_2$ are each independently selected from the group of an alkyl, an aryl, or hydrogen, wherein $R_1$ and $R_2$ comprise one or fewer hydrogen atoms, a second corrosion inhibitor having a structure:

wherein R, $R_3$, and $R_4$ are each independently selected from the group of hydrogen or an alkyl, hydroxy, amino, imino, carboxy, mercapto, nitro, benzoyl, or aryl functional group, and $R_5$ and $R_6$ together are a fused ring, or $R_5$ and $R_6$ are each independently selected from the group of hydrogen, alkyl, hydroxy, amino, imino, carboxy, mercapto, nitro, or aryl functional group, wherein $R_5$ and $R_6$ comprise one or fewer hydrogen atoms, a suppressor, a solvent, and an inorganic acid based electrolyte to provide a pH between about 3 and about 10. In an alternative embodiment of the composition described above, a surfactant may be used instead of the second corrosion inhibitor.

One aspect or component of the present invention is the use of a plurality of chelating agents to complex with the surface of the substrate to enhance the electrochemical dissolution process. In any of the embodiments described herein, the chelating agents can bind to a conductive material, such as copper ions, increase the removal rate of metal materials and/or improve dissolution uniformity across the substrate surface. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The chelating agents may also be used to buffer the polishing composition to maintain a desired pH level for processing a substrate. The chelating agents may also form or enhance the formation of a passivation layer on the substrate surface.

The plurality of chelating agents includes at least a first chelating agent having a carboxylate functional group and a second chelating agent having an amine or amide functional group. The chelating agent having a carboxylate functional group include compounds having one or more functional groups selected from the group of carboxylate functional groups, dicarboxylate functional groups, tricarboxylate functional groups, a mixture of hydroxyl and carboxylate functional groups, or combinations thereof. The one or more chelating agents may also include salts of the chelating agents described herein, for example, ammonia and potassium salts thereof. The chelating agent having the carboxylate functional group may be in the composition at a concentration between about 0.1 weight percent (wt. %) and 10 wt. %, such as between about 1 wt. % and about 3 wt. % of the composition.

Examples of suitable first chelating agents having one or more carboxylate functional groups include citric acid, tartaric acid, succinic acid, oxalic acid, amino acids, salts thereof, or combinations thereof. For example, suitable salts for the chelating agent may include ammonium citrate, potassium citrate, ammonium succinate, potassium succinate, ammonium oxalate, potassium oxalate, potassium tartrate, or combinations thereof. The salts may have multi-basic states, for example, citrates have mono-, di- and tri-basic states. Other suitable chelating agents having one or more carboxylate functional groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof or combinations thereof. Suitable first chelating agents may be free of an amine or amide functional groups.

The second chelating agent having an amine or amide functional group can include compounds such as ethylenediamine (EDA), diethylenetriamine, diethylenetriamine derivatives, hexadiamine, amino acids, glycine, methylformamide, derivatives thereof, salts thereof or combinations thereof. The chelating agent having an amine or amide functional group may be in the composition at a concentration between about 0.1 vol. % and 15 vol. %, such as between about 0.2 vol. % and about 2 vol. % of the composition. For example, about 2 vol. % by volume of ethylenediamine may be used as a chelating agent an amine or amide functional group. Suitable second chelating agents may be free of one or more carboxylate functional groups.

The composition includes a first corrosion inhibitor and a second corrosion inhibitor. The corrosion inhibitors can be added to reduce the oxidation or corrosion of metal surfaces by forming a passivation layer that minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution.

The composition includes a first corrosion inhibitor having the structure:

wherein R is hydrogen, an alkyl, hydroxy, amino, imino, carboxy, mercapto, nitro, or aryl functional group, $R_1$ and $R_2$ together comprise a fused ring, or $R_1$ and $R_2$ are each independently selected from the group of an alkyl, an aryl, or hydrogen, wherein $R_1$ and $R_2$ comprise one or fewer hydrogen atoms. Examples of organic compounds having azole groups include benzotriazole (BTA), mercaptobenzotriazole, 5-methyl-1-benzotriazole (TTA), tolyltriazole (TTA), derivatives thereof or combinations thereof.

A second corrosion inhibitor having a structure:

wherein R, $R_3$, and $R_4$ are each independently selected from the group of hydrogen or an alkyl, hydroxy, amino, imino, carboxy, mercapto, nitro, benzoyl, or aryl functional group, and $R_5$ and $R_6$ together are a fused ring, or $R_5$ and $R_6$ are each independently selected from the group of hydrogen, alkyl, hydroxy, amino, imino, carboxy, mercapto, nitro, or aryl functional group, wherein $R_5$ and $R_6$ comprise one or fewer hydrogen atoms. Examples of suitable compounds include 1,2,4 triazole, benzoylimidazole (BIA), benzimidazole, derivatives thereof or combinations thereof.

The polishing composition may include a combined corrosion inhibitor concentration between about 0.05 weight percent (wt. %) and about 2 wt. % of the composition, such as between about 0.05 weight percent (wt. %) and about 0.8 wt. %. The first corrosion inhibitor may have a concentration between 0.025 wt. % and about 0.8 wt. %, such as between about 0.1 wt. % and about 0.4 wt. %. The second corrosion inhibitor may have a concentration between 0.025 wt. % and about 0.8 wt. %, such as between about 0.05 wt. % and about 0.2 wt. %. The first and second corrosion inhibitors may be provided at a ratio of first corrosion inhibitor concentration to second corrosion inhibitor concentration between about 1:2 and about 8:1, such as between about 1:1 and about 8:1.

Suppressors, such as electrically resistive additives that reduce the conductivity of the polishing composition may be added to the composition in a range from about 0.005% to about 2% by volume or weight of the composition. Suppressors include polyacrylamide, polyacrylic acid polymers, polycarboxylate copolymers, coconut diethanolamide, oleic diethanolamide, ethanolamide derivatives, or combinations thereof.

Alternatively, a surfactant may be used instead of the second corrosion inhibitor. Surfactants may be used in the polishing composition to increase the dissolution or solubility of materials, such as metals and metal ions or by-products produced during processing, improve chemical stability, and reduce decomposition of components of the polishing composition. The one or more surfactants can comprise a concentration between about 0.01 vol.% and about 0.5 vol.% of the polishing composition. The one or more surfactants may include non-ionic surfactants as well as ionic surfactants including anionic surfactants, cationic surfactants, amphoteric surfactants, and ionic surfactants having more than one ionic functional group, such as Zwitter-ionic surfactants. Dispersers or dispersing agents are considered to be surfactants as surfactants are used herein. An example of a surfactant that may be used in the composition described herein is polystep-B1, commercially available from Stepan Company, of Northfield Ill. Another example of a suitable surfactant is ammonium dodecyl sulfate. The first corrosion inhibitor and surfactant may be provided at a ratio of first corrosion inhibitor concentration to surfactant concentration between about 1:2 and about 8:1, such as between about 1:1 and about 8:1.

Alternatively, a third chelating agent may include a compound having a carboxylate functional group and an amine, amide, and/or imido functional groups may be used in the place of the second corrosion inhibitor. An example of chelating agent having one or more carboxylate functional groups and an amine, amide, and/or imido functional group include amino acids, such as glycine, or imidodiacetic acid. In another example, ethylenediaminetetraacetic acid (EDTA) may be used in the composition. A salt of the compound having a carboxylate functional group and an amine, amide, and/or imido functional groups may be used. Examples of such salts include sodium, potassium and calcium salts, such as $Na_2EDTA$, $Na_4EDTA$, $K_4EDTA$ or $Ca_2EDTA$. The first corrosion inhibitor and third chelating agent may be provided at a ratio of first corrosion inhibitor concentration to third chelating agent concentration between about 1:8 and about 1:1, such as between about 1:7 and about 1:4.

The polishing composition also includes an inorganic acid based electrolyte system for providing electrical conductivity and providing a suitable pH for chemical reactions of the composition described herein. Suitable acid based electrolyte systems include, for example, phosphoric acid based electrolytes, sulfuric acid, nitric acid, perchloric acid, or combinations thereof. The inorganic acid based electrolyte systems include acid electrolyte derivatives, including ammonium, potassium, sodium, calcium and copper salts thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, copper phosphate, potassium phosphates ($K_xH_{(3-X)}PO_4$) (x=1, 2 or 3), such as potassium dihydrogen phosphate ($KH_2PO_4$), dipotassium hydrogen phosphate ($K_2HPO_4$), ammonium phosphates (($NH_4)_xH_{(3-X)}PO_4$) (x=1, 2 or 3), such as ammonium dihydrogen phosphate (($NH_4)H_2PO_4$), diammonium hydrogen phosphate (($NH_4)_2HPO_4$), compounds having a nitrite group ($NO_3^{1-}$), such as, nitric acid or copper nitrate, compounds having a boric group ($BO_3^{3-}$), such as, orthoboric acid ($H_3BO_3$) and compounds having a sulfate group ($SO_4^{2-}$), such as sulfuric acid ($H_2SO_4$), ammonium hydrogen sulfate (($NH_4)HSO_4$), ammonium sulfate, potassium sulfate, copper sulfate, derivatives thereof or combinations thereof. The invention also contemplates that conventional electrolytes known and unknown may also be used in forming the composition described herein using the processes described herein.

The acid based electrolyte system may contains an acidic component that can take up about 1 to about 30 percent by weight (wt. %) or volume (vol. %), for example, between about 2 wt. % and about 6 wt. %, of the total composition of solution to provide suitable conductivity for practicing the processes described herein.

The balance or remainder of the polishing compositions described herein is a solvent, such as a polar solvent, including water, preferably deionized water. Other solvent may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof or combinations thereof.

The compositions herein may have a pH between about 3 and about 10, such as between a pH of about 3 and about 7, for example, a pH between about 4 and about 6.

Ecmp solutions of varying compositions may be used to remove bulk material and residual material, such as copper and/or copper alloys, as well as to remove barrier materials, such as tantalum nitrides or titanium nitrides. Specific formulations of the polishing compositions are used to remove the particular materials. Polishing compositions utilized during embodiments herein are advantageous for Ecmp processes. Generally, Ecmp solutions are much more conductive than traditional CMP solutions. The Ecmp solutions have a conductivity of about 10 mS/cm or higher, while traditional CMP solutions have a conductivity from about 3 mS/cm to about 5 mS/cm. The conductivity of the Ecmp solutions greatly influences that rate at which the Ecmp process advances, i.e., more conductive solutions have a faster material removal rate. The compositions formed herein may generally have a conductivity between about 10 mS/cm and about 80 mS, such as between about 30 mS/cm and about 50 mS, for example, about 40 mS/cm. The composition may be adjusted in conductivity based on the process being performed. For removing bulk material, the Ecmp solution has a conductivity of about 10 mS/cm or higher, preferably in a range from about 30 mS/cm to about 60 mS/cm. For residual material, the Ecmp solution has a conductivity of about 10 mS/cm or higher, preferably in a range from about 15 mS/cm to about 40 mS/cm.

The substrate is exposed to a polishing composition described herein that forms a passivation layer 190 on the conductive material layer 160. The passivation layer 190 forms on the exposed conductive material 160 on the substrate surface including the high overburden 170, peaks, and minimal overburden 180, valleys, formed in the deposited conductive material 160. The passivation layer 190 chemically and/or electrically insulates the surface of the substrate from chemical and/or electrical reactions. The passivation layer is formed from the exposure of the substrate surface to the corrosion inhibitor and/or other materials capable of forming a passivating or insulating film, for example, chelating agents. The thickness and density of the passivation layer can dictate the extent of chemical reactions and/or amount of anodic dissolution. For example, a thicker or denser passivation layer 190 has been observed to result in less anodic dissolution compared to thinner and less dense passivation layers. Thus, control of the composition of passivating agents, corrosion inhibitors and/or chelating agents, allow control of the removal rate and amount of material removed from the substrate surface.

FIG. 2B illustrates electrochemical mechanical polishing during processing. During processing, the substrate surface and a polishing article, such as conductive polishing article 610, are contacted with one another and moved in relative motion to one another, such as in a relative orbital motion, to remove portions of the passivation layer 190 formed on the exposed conductive material 160, which contact may additionally also remove a portion of the underlying conductive material 160.

The substrate surface and polishing article 610 are contacted at a pressure less than about 2 pounds per square inch (lb/in$^2$ or psi) (13.8 kPa). Removal of the passivation layer 190 and some conductive material 160 may be performed with a process having a pressure of about 1 psi (6.9 kPa) or less, for example, from about 0.01 psi (69 Pa) to about 0.5 psi (3.4 kPa). In one aspect of the process, the substrate surface and polishing article are contacted at a pressure of about 0.2 psi (1.4 kPa) or less.

The polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as dishing and scratches, and delamination, during polishing. Contact between the substrate and a conductive polishing article also allows for electrical contact between the power source and the substrate by coupling the power source to the polishing article when contacting the substrate. A region of non-passivated material may be exposed and removed by anodic dissolution by mechanical abrasion to disturb or remove the passivation layer on the surface of the substrate.

In one embodiment the platen is rotated at a velocity from about 3 rpm (rotations per minute) to about 100 rpm, and the polishing head is rotated at a velocity from about 5 rpm to about 200 rpm and also moved linearly at a velocity from about 5 cm/s (centimeters per second) to about 25 cm/s in a direction radial to the platen. The preferred ranges for a 200 mm diameter substrate are a platen rotational velocity from about 5 rpm to about 40 rpm and a polishing head rotational velocity from about 7 rpm to about 100 rpm and a linear (e.g., radial) velocity of about 10 cm/s. The preferred ranges for a 300 mm diameter substrate are a platen rotational velocity from about 5 rpm to about 20 rpm and a polishing head rotational velocity from about 7 rpm to about 50 rpm and a linear (e.g., radial) velocity of about 10 cm/s. In one embodiment of the present invention the platen has a diameter between about 17 inches (43.2 cm) and about 30 inches (76.2 cm). The polishing head may move along the radius of the platen for a distance between about 0.1 inches (2.5 mm) and about 2 inches (5.1 cm). The carrier head rotational speed may be greater than a platen rotational speed by a ratio of carrier head rotational speed to platen rotational speed of greater than about 1:1, such as a ratio of carrier head rotational speed to platen rotational speed between about 1.5:1 and about 12:1, for example between about 1.5:1 and about 3:1, to remove material from the substrate surface.

A bias is applied to the substrate during contact between the substrate surface and the conductive polishing article for anodic dissolution of the conductive material 160 from the substrate surface. The bias is generally provided to produce anodic dissolution of the conductive material from the surface of the substrate at a current density up to about 100 mA/cm$^2$ which correlates to an applied current of about 40 amps to process substrates with a diameter up to about 300 mm. For example, a 200 mm diameter substrate may have a current density from about 0.01 mA/cm$^2$ to about 50 mA/cm$^2$, which correlates to an applied current from about 0.01 A to about 20 A. The invention also contemplates that the bias may be applied and monitored by volts, amps and watts. For example, in one embodiment, the power supply may apply a power between about 0.1 watts and 100 watts, a voltage between about 0.1 V and about 10 V, and a current between about 0.1 amps and about 10 amps.

During anodic dissolution under application of the bias, the substrate surface, i.e., the conductive material layer 160 may be biased anodically above a threshold potential of the conductive material, for example, a metal material, on the substrate surface-to "oxidize". When a metal material oxidizes, a metal atom gives up one or more electrons to the power source and forms metal ions or cations. The metal ions may then leave the substrate surface and dissolve into the electrolyte solution. In the case where copper is the desired material to be removed, cations can have the $Cu^{1+}$ or $Cu^{2+}$ oxidation state.

The metal ions may also contribute to the formation of the thickness and/or density of the passivation layer 190. For example, the inhibitors and/or chelating agents found in the polishing composition may complex with the metal ions and the metal ions become incorporated into the passivation layer 190. Thus, the presence of the inhibitors and/or chelating agents found in the polishing composition limit or reduce the electrochemical dissolution process of the metal ions into the electrolyte, and further incorporate such metal ions into the passivation layer 190. It has been observed that the thickness and/or density of the undisturbed passivation layer may increase after periods of applied bias for anodic dissolution of conductive materials on the substrate surface. It is believed that the increase in the thickness and/or density of the undisturbed passivation layer is related to the total applied power and is a function of time and/or power levels. It has also been observed that the undisturbed passivation layer incorporates metal ions and that the metal ions may contribute to the thickness and/or density of the passivation layer.

The bias may be varied in power and application depending upon the user requirements in removing material from the substrate surface. For example, increasing power application has been observed to result in increasing anodic dissolution. The bias may also be applied by an electrical pulse modulation technique. Pulse modulation techniques may vary, but generally include a cycle of applying a constant current density or voltage for a first time period, then applying no current density or voltage or a constant reverse current density or voltage for a second time period. The process may then be repeated for one or more cycles, which may have varying power levels and durations. The power levels, the duration of power, an "on" cycle, and no power, an "off cycle" application, and frequency of cycles, may be modified based on the removal rate, materials to be removed, and the extent of the polishing process. For example, increased power levels and increased duration of power being applied have been observed to increase anodic dissolution.

In one pulse modulation process for electrochemical mechanical polishing, the pulse modulation process comprises an on/off power technique with a period of power application, "on", followed by a period of no power application, "off". The on/off cycle may be repeated one or more times during the polishing process. The "on" periods allow for removal of exposed conductive material from the substrate surface and the "off" periods allow for polishing composition components and by-products of "on" periods, such as metal ions, to diffuse to the surface and complex with the conductive material. During a pulse modulation technique process it is believed that the metal ions migrate and interact with the corrosion inhibitors and/or chelating agents by attaching to the passivation layer in the non-mechanically disturbed areas. The process thus allows etching in the electrochemically active regions, not covered by the passivation layer, during an "on" application, and then allowing reformation of the passivation layer in some regions and removal of excess material during an "off" portion of the pulse modulation technique in other regions. Thus, control of the pulse modulation technique can control the removal rate and amount of material removed from the substrate surface.

The "on"/"off" period of time may be between about 1 second and about 60 seconds each, for example, between about 2 seconds and about 25 seconds, and the invention contemplates the use of pulse techniques having "on" and "off" periods of time greater and shorter than the described time periods herein. In one example of a pulse modulation technique, power is applied between about 16% and about 66% of each cycle.

Non-limiting examples of pulse modulation technique with an on/off cycle for electrochemical mechanical polishing of materials described herein include: applying power, "on", between about 5 seconds and about 10 seconds and then not applying power, "off", between about 2 seconds and about 25 seconds; applying power for about 10 seconds and not applying power for 5 seconds, or applying power for 10 seconds and not applying power for 2 seconds, or even applying power for 5 seconds and not applying power for 25 seconds to provide the desired polishing results. The cycles may be repeated as often as desired for each selected process. One example of a pulse modulation process is described in commonly assigned U.S. Pat. No. 6,379,223, which is incorporated by reference herein to the extent not inconsistent with the claimed aspects and disclosure herein. Further examples of a pulse modulation process is described in co-pending U.S. Ser. No. 10/611,805, entitled "Effective Method To Improve Surface Finish In Electrochemically Assisted Chemical Mechanical Polishing," filed on Jun. 30, 2003, which is incorporated by reference herein to the extent not inconsistent with the claimed aspects and disclosure herein.

A removal rate of conductive material of up to about 15,000 Å/min can be achieved by the processes described herein. Higher removal rates are generally desirable, but due to the goal of maximizing process uniformity and other process variables (e.g., reaction kinetics at the anode and cathode) it is common for dissolution rates to be controlled from about 100 Å/min to about 15,000 Å/min. In one embodiment of the invention where the copper material to be removed is less than 5,000 Å thick, the voltage (or current) may be applied to provide a removal rate from about 100 Å/min to about 5,000 Å/min. The substrate is typically exposed to the polishing composition and power application for a period of time sufficient to remove at least a portion or all of the desired material disposed thereon.

In one embodiment of the Ecmp process, the removal rate of conductive material 160 is much faster during the first Ecmp process than during the second Ecmp process. For example, the first Ecmp process removes conductive material 160 at a rate from about 1,000 Å/min to about 15,000 Å/min, while the second Ecmp process removes conductive material 160 at a rate from about 100 Å/min to about 8,000 Å/min. The second Ecmp process is slower in order to prevent excess metal removal to form topographical defects, such as concavities or depressions known as dishing 55, as shown in FIG. 2B. Therefore, a majority of the conductive material 160 is removed at a faster rate during the first Ecmp process than the remaining conductive layer 160 during the second Ecmp process. The two-step Ecmp process increases throughput of the total substrate processing and while producing a smooth surface with little or no defects.

Mechanical abrasion by a conductive polishing article removes the passivation layer that insulates or suppresses the current for anodic dissolution, such that areas of high overburden is preferentially removed over areas of minimal overburden as the passivation layer is retained in areas of minimal or no contact with the conductive polishing article. The removal rate of the conductive material 160 covered by the passivation layer is less than the removal rate of conductive material without the passivation layer. As such, the excess material disposed over narrow feature definitions 120 and the substrate field 150 is removed at a higher rate than over wide feature definitions 130 still covered by the passivation layer 190.

FIG. 2C illustrates that at least about 50% of the conductive material 160 was removed after the bulk removal of the first Ecmp process, for example, about 90%. After the first Ecmp process, conductive material 160 may still include the high overburden 170, peaks, and/or minimal overburden 180, valleys, but with a reduced proportionally size. However, conductive material 160 may also be rather planar across the substrate surface (not shown).

Referring to FIG. 2D, most, if not all of the conductive layer 160 is removed to expose barrier layer 140 and conductive trenches 165 by polishing the substrate with a second Ecmp process including a second Ecmp polishing composition. The conductive trenches 165 are formed by the remaining conductive material 160. The second polishing step may be performed under the processing parameters described herein and the second polishing composition may comprise a polishing composition formulated with the components described herein. One example of a second polishing step and composition for the second polishing step is disclosed in commonly assigned and co-pending U.S. Ser. No. 11/123,274, filed May 5, 2005, and published as US 20050218010, which is incorporated herein to the extent not inconsistent with the claims aspects and disclosure herein. Alternatively, the conductive material 160 may be removed to the barrier layer as shown in FIG. 2D is a single Ecmp polishing step with the polishing composition disclosed herein by the processing parameters described herein.

The barrier material, and alternatively, any further residual conductive material, may then be polished by a third polishing step to provide a planarized substrate surface containing conductive trenches 165, as depicted in FIG. 2E. The residual conductive material and barrier material may be removed by a third polishing process, such as a third Ecmp process or a CMP process. An example of a copper polishing process is disclosed in U.S. Pat. No. 6,790,768 and an example of a barrier polishing process is disclosed in commonly assigned and co-pending U.S. Ser. No. 10/193,810, filed Jul. 11, 2002, and published as US 20030013306, which are both incorporated herein to the extent not inconsistent with the claims aspects and disclosure herein.

After conductive material and barrier material removal processing steps, the substrate may then be buffed to minimize surface defects. Buffing may be performed with a soft polishing article, i.e., a hardness of about 40 or less on the Shore D hardness scale as described and measured by the American Society for Testing and Materials (ASTM), headquartered in Philadelphia, Pa., at reduced polishing pressures, such as about 2 psi or less. An example of a suitable buffing process and composition is disclosed in U.S. Pat. Ser. No. 6,858,540, issued on Dec. 8, 2002, and incorporated herein by reference to the extent not inconsistent with the invention.

Optionally, a cleaning solution may be applied to the substrate after each of the polishing process to remove particulate matter and spent reagents from the polishing process as well as help minimize metal residue deposition on the polishing articles and defects formed on a substrate surface. An example of a suitable cleaning solution is ELECTRACLEAN™ commercially available from Applied Materials, Inc., of Santa Clara, Calif.

Finally, the substrate may be exposed to a post polishing cleaning process to reduce defects formed during polishing or substrate handling. Such processes can minimize undesired oxidation or other defects in copper features formed on a substrate surface. An example of such a post polishing cleaning is the application of ELECTRACLEAN™, commercially available from Applied Materials, Inc., of Santa Clara, Calif.

It has been observed that substrate planarized by the processes described herein have exhibited reduced topographical defects, such as dishing, reduced residues, improved planarity, and improved substrate finish. The processes described herein may be further disclosed by the examples as follows.

EXAMPLES

The following non-limiting examples are provided to further illustrate embodiments of the invention. However, the examples are not intended to be all-inclusive and are not intended to limit the scope of the inventions described herein.

Example 1

A copper plated substrate with 300 mm diameter was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was placed onto the first platen and exposed to a polishing composition of:
  about 6% by volume phosphoric acid;
  about 2% by volume ethylenediamine;
  about 2% by weight ammonium citrate;
  about 0.15% by weight benzotriazole (BTA);
  about 0.15% by weight benzoylimidazol (BIA);
  from about 2% to about 6% by volume 40% KOH solution to provide a pH of about 5;
  about 0.45% by volume of hydrogen peroxide;
  about 0.15% by weight of silica ($SiO_2$) abrasive particles; and
  de-ionized water.

A polishing article was contacted with the substrate at about 0.2 psi and a bias of about 3 volts was applied during the process.

Example 2

Another composition was formulated with a first to second corrosion inhibitor ratio of 1:1 as:
  about 6% by volume phosphoric acid;
  about 2% by volume ethylenediamine;
  about 2% by weight ammonium citrate;
  about 0.2% by weight benzotriazole (BTA);
  about 0.2% by weight benzoylimidazol (BIA);
  from about 2% to about 6% by volume 40% KOH solution to provide a pH of about 5;
  about 0.45% by volume of hydrogen peroxide; and
  deionized water.

Example 3

Another composition was formulated with a first to second corrosion inhibitor ratio of 1:1 as:
  about 6% by volume phosphoric acid;
  about 2% by volume ethylenediamine;
  about 2% by weight ammonium citrate;
  about 0.15% by weight tolyltriazole (TTA);
  about 0.15% by weight benzoylimidazol (BIA);
  from about 2% to about 6% by volume 40% KOH solution to provide a pH of about 5;
  about 0.45% by volume of hydrogen peroxide; and
  deionized water.

Example 4

Another composition was formulated with a first corrosion inhibitor to surfactant ratio of 1:1 as:
  about 6% by volume phosphoric acid;
  about 2% by volume ethylenediamine;
  about 2% by weight ammonium citrate;
  about 0.15% by weight benzotriazole (BTA);
  about 0.15% by weight polystep-B1
  from about 2% to about 6% by volume 40% KOH solution to provide a pH of about 5;
  about 0.45% by volume of hydrogen peroxide; and
  deionized water.

Example 5

Another composition comprises:
  about 6% by volume phosphoric acid;
  about 2% by volume ethylenediamine;
  about 2% by weight ammonium citrate;
  about 1% by weight glycine;
  about 0.15% by weight tolyltriazole (TTA);
  from about 2% to about 6% by volume 40% KOH solution to provide a pH of about 5; and
  about 0.45% by volume of hydrogen peroxide; and
  deionized water.

Example 6

Another composition comprises:
  about 6% by volume phosphoric acid;
  about 2% by volume ethylenediamine;
  about 2% by weight ammonium citrate;
  about 1% by weight glycine;
  about 0.25% by weight Benzotriazole (BTA);
  from about 2% to about 6% by volume 40% KOH solution to provide a pH of about 5; and
  about 0.45% by volume of hydrogen peroxide; and
  deionized water.

Example 7

Another composition comprises:
  about 6% by volume phosphoric acid;
  about 2% by volume ethylenediamine;
  about 2% by weight ammonium citrate;
  about 1% by weight glycine;
  about 0.3% by weight Benzotriazole (BTA);
  from about 2% to about 6% by volume 40% KOH solution to provide a pH of about 5; and
  about 0.45% by volume of hydrogen peroxide; and
  deionized water.

While the foregoing is directed to embodiments of the present invention, other and further embodiments of the invention may be devised without departing from the basic scope thereof, and the scope thereof is determined by the claims that follow.

What is claimed is:

1. A composition for removing at least a conductive material from a substrate surface, comprising:
  a first chelating agent having one or more carboxylate functional groups;
  a second chelating agent having one or more amine or amide functional groups;
  a first corrosion inhibitor, wherein the first corrosion inhibitor is benzotriazole;
  a second corrosion inhibitor, wherein the second corrosion inhibitor is benzoylimidazol
  a suppressor;
  a solvent; and
  an inorganic acid based electrolyte to provide a pH between about 3 and about 10, wherein the composition has a conductivity between about 10 mS/cm and about 80 mS/cm.

2. The composition of claim 1, wherein the first chelating agent is selected from the group of citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof and combinations thereof, and salts thereof, and the second chelating agent is selected from the group of ethylenediamine (EDA), diethylenetriamine, diethylenetriamine derivatives, hexadiamine, amino acids, glycine, ethylenediaminetetraacetic acid (EDTA), methylformamide, derivatives thereof, salts thereof and combinations thereof.

3. The composition of claim 2, wherein the first chelating agent further includes an amine or amide functional group and is selected from the group of amino acids and imidoacetic acid.

4. The composition of claim 1, wherein the suppressor is selected from the group of polyacrylamide, polyacrylic acid polymers, polycarboxylate copolymers, coconut diethanolamide, oleic diethanolamide, ethanolamide derivatives, and combinations thereof.

5. The composition of claim 1, wherein the composition comprises:
   between about 1 vol.% and about 10 vol.% of the first chelating agent;
   between about 1 vol.% and about 15 vol.% of the second chelating agent;
   between about 0.05 vol.% and about 0.8 vol.% of the first corrosion inhibitor and the second corrosion inhibitor;
   between about 0.005 vol.% and about 2 vol.% of the suppressor;
   a solvent; and
   an inorganic acid based electrolyte to provide a pH between about 3 and about 10, wherein the composition has a conductivity between about 30 mS/cm and about 50 mS/cm.

6. The composition of claim 1, wherein the first chelating agent is selected from the group of citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, salts thereof and combinations thereof, and salts thereof.

7. The composition of claim 1, wherein the first chelating agent is selected from the group of ammonium citrate, potassium citrate, ammonium succinate, potassium succinate, ammonium oxalate, potassium oxalate, potassium tartrate, and combinations thereof.

8. The composition of claim 7, wherein the first chelating agent is ammonium citrate.

9. The composition of claim 6, wherein the second chelating agent is selected from the group of ethylenediamine (EDA), diethylenetriamine, diethylenetriamine derivatives, hexadiamine, amino acids, glycine, ethylenediaminetetraacetic acid (EDTA), methylformamide, derivatives thereof, salts thereof, and combinations thereof.

10. The composition of claim 8, wherein the second chelating agent is ethylenediamine.

11. The composition of claim 1, wherein the inorganic acid based electrolyte is selected from the group of phosphoric acid based electrolytes, sulfuric acid, nitric acid, perchloric acid, and combinations thereof.

12. The composition of claim 11, wherein the inorganic acid based electrolyte is a phosphoric acid based electrolyte.

13. The composition of claim 1, wherein the ratio of first corrosion inhibitor concentration to second corrosion inhibitor concentration is between about 1:2 and about 8:1.

* * * * *

UNITED STATES PATENT AND TRADEMARK OFFICE
CERTIFICATE OF CORRECTION

PATENT NO. : 7,390,429 B2  Page 1 of 1
APPLICATION NO. : 11/312823
DATED : June 24, 2008
INVENTOR(S) : Liu et al.

It is certified that error appears in the above-identified patent and that said Letters Patent is hereby corrected as shown below:

On the Title Page Item (22)

Please insert --PCT International Search Report and Written Opinion dated March 30, 2007 for PCT International Application No. PCT/US2006/30381--;

On the Title Page Item -56-

In the References Cited (56):

Please delete "6,194,317 B1 2/2001 Kalsaki et al." and insert --6,194,317 B1 2/2001 Kaisaki et al.-- therefor;

Please delete "6,821,841 B1 11/2004 Tsai et al." and insert --6,821,881 B2 11/2004 Tsai et al.-- therefor;

Column 7, Line 67, please delete "conducive" and insert --conductive--.

Signed and Sealed this

Twenty-sixth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,390,429 B2  Page 1 of 1
APPLICATION NO. : 11/312823
DATED : June 24, 2008
INVENTOR(S) : Liu et al.

It is certified that error appears in the above-identified patent and that said Letters Patent is hereby corrected as shown below:

On the Title Page Item (56) References Cited, Other Publications

Please insert --PCT International Search Report and Written Opinion dated March 30, 2007 for PCT International Application No. PCT/US2006/30381--;

On the Title Page Item -56-

In the References Cited (56):

Please delete "6,194,317 B1 2/2001 Kalsaki et al." and insert --6,194,317 B1 2/2001 Kaisaki et al.-- therefor;

Please delete "6,821,841 B1 11/2004 Tsai et al." and insert --6,821,881 B2 11/2004 Tsai et al.-- therefor;

Column 7, Line 67, please delete "conducive" and insert --conductive--.

This certificate supersedes the Certificate of Correction issued May 26, 2009.

Signed and Sealed this

Seventh Day of July, 2009

JOHN DOLL
*Acting Director of the United States Patent and Trademark Office*